United States Patent
Kranz et al.

(10) Patent No.: US 6,908,865 B2
(45) Date of Patent: Jun. 21, 2005

(54) METHOD AND APPARATUS FOR CLEANING SUBSTRATES

(75) Inventors: Martin Kranz, Ottendorf-Okrilla (DE); Srinivas Guggilla, Sunnyvale, CA (US); Suraj Rengarajan, San Jose, CA (US); Mei Chang, Saratoga, CA (US); Gongda Yao, Fremont, CA (US); Nitin Khurana, Milpitas, CA (US); Gilbert Hausmann, Felton, CA (US)

(73) Assignee: Applied Materials, Inc., Santa Clara, CA (US)

( * ) Notice: Subject to any disclaimer, the term of this patent is extended or adjusted under 35 U.S.C. 154(b) by 149 days.

(21) Appl. No.: 10/015,433

(22) Filed: Dec. 12, 2001

(65) Prior Publication Data

US 2003/0062333 A1 Apr. 3, 2003

Related U.S. Application Data

(60) Provisional application No. 60/325,712, filed on Sep. 28, 2001.

(51) Int. Cl.$^7$ ............................................. H01L 21/302
(52) U.S. Cl. ........................ 438/710; 438/712; 438/714; 438/715; 438/720
(58) Field of Search ................................ 438/706, 710, 438/712, 714, 715, 720, 722

(56) References Cited

U.S. PATENT DOCUMENTS

| | | | |
|---|---|---|---|
| 5,043,299 A | 8/1991 | Chang et al. | 437/192 |
| 5,199,483 A | 4/1993 | Bahng | 165/1 |
| 5,236,537 A * | 8/1993 | Asaka | 156/345.31 |
| 5,312,509 A | 5/1994 | Eschbach | 156/345 |
| 5,695,564 A | 12/1997 | Imahashi | 118/719 |
| 5,785,796 A | 7/1998 | Lee | 156/345 |
| 5,996,353 A * | 12/1999 | Maxwell et al. | 62/3.2 |
| 6,033,482 A * | 3/2000 | Parkhe | 118/728 |
| 6,068,729 A | 5/2000 | Shrotriya | 156/345 |
| 6,107,192 A * | 8/2000 | Subrahmanyan et al. | 438/637 |
| 6,124,210 A | 9/2000 | Chino et al. | 438/706 |
| 6,132,517 A | 10/2000 | Sivaramakrishnan et al. | 118/719 |
| 6,132,813 A * | 10/2000 | Chen et al. | 427/490 |
| 6,176,968 B1 | 1/2001 | Fujii | 156/345 |
| 6,217,786 B1 * | 4/2001 | Hills et al. | 216/79 |
| 6,337,277 B1 * | 1/2002 | Chou et al. | 438/689 |
| 6,451,181 B1 * | 9/2002 | Denning et al. | 204/192.17 |

* cited by examiner

*Primary Examiner*—Lan Vinh
*Assistant Examiner*—Binh X. Tran
(74) *Attorney, Agent, or Firm*—Moser, Patterson & Sheridan LLP

(57) ABSTRACT

Generally, a method for pre-cleaning native oxides and other contaminants from apertures on a substrate is provided. In one embodiment, a method for pre-cleaning apertures on a substrate includes disposing the substrate on a support member in a process chamber, cooling the substrate at least to a temperature of 100 degrees Celsius, and exposing the substrate to a pre-clean process. In another embodiment, a method for pre-cleaning apertures on a substrate includes cooling the substrate at least to a temperature of 100 degrees Celsius in a first chamber, transferring the substrate to a second chamber and pre-cleaning the substrate in the second chamber while maintaining a substrate temperature of 100 degrees Celsius.

6 Claims, 8 Drawing Sheets

METHOD AND APPARATUS FOR CLEANING SUBSTRATES

CROSS-REFERENCE TO RELATED APPLICATIONS

This application claims benefit of U.S. Provisional Patent Application Ser. No. 60/325,712, filed Sep. 28, 2001, which is herein incorporated by reference.

BACKGROUND OF THE INVENTION

1. Field of the Invention

Embodiments of the invention generally relate to a method and apparatus for cleaning an at least partially exposed copper layer disposed on a substrate.

2. Background of the Related Art

Sub-quarter micron, multi-level metallization is a key technology for the next generation of ultra large scale integration (ULSI). This technology utilizes interconnect features, for example, contacts, vias and lines, that are formed by planarization of films formed in high aspect ratio apertures. Reliable formation of these interconnect features is important to the success of the next generation of ULSI, and to a continued effort to increase circuit density and quality on individual substrates and die.

The increase in circuit density primarily results from a decrease in the widths of interconnect features such as vias, contacts and other features, as well as from a decrease in the thickness of dielectric materials disposed between these interconnect features. Typically, cleaning the apertures to remove contaminants prior to metallization is required to improve device integrity and performance. The decrease in width of the apertures results in larger aspect ratios for the apertures and increased difficulty in cleaning the apertures prior to filling the apertures with metal or other materials. Failure to clean the apertures can result in void formation within the apertures or an increase in the resistance of the interconnect features. Therefore, there is a great amount of ongoing effort being directed at cleaning small apertures having high aspect ratios, especially where the ratio of feature height to width is 3:1 or larger.

The presence of native oxides and other contaminants such as etch residue within a small apertures are problematic because they contribute to void formation during metallization by promoting uneven distribution of a depositing material such as metal. Regions of increased growth can merge and seal the small apertures before regions of slower growth can be filled with the depositing metal. It is known that native oxides form within the apertures when a portion of a layer (or sublayer), such as silicon, aluminum, or copper, is exposed to oxygen in the atmosphere or is damaged during a plasma etch step. Other contaminants within the apertures can be sputtered material from an oxide over-etch, residual photoresist from a stripping process, leftover polymer from a previous oxide etch step, or redeposited material from a sputter etch process.

The presence of native oxides and other contaminants is also problematic because they can reduce the electromigration resistance of vias and small apertures. The contaminants can diffuse into a dielectric layer, a sublayer, or a deposited metal and alter the performance of devices that include the small features. Even if contamination is limited to a thin boundary region within the features, the thin boundary region is a substantial part of the small features. An acceptable level of contaminants in the features decreases as the features get smaller in width.

Pre-cleaning of features to remove native oxides and other contaminants has become increasingly utilized to prepare surfaces for barrier layer or metal deposition. Conventional pre-clean processes typically include a plasma etch to remove contaminants and expose native oxides. The native oxides may then be removed by an etching process or removed using a reduction reaction. However, when used to pre-clean copper, conventional pre-clean processes typically result in sputtered or etched copper from an underlying layer being deposited on sidewalls of an apertures. The deposited copper is generally in the form of agglomerated copper particles that create an uneven and rough sidewall surface which adversely effects subsequent depositions. In particular, the agglomerated copper causes void formation, thereby contributing to device defects and defective substrates.

Additionally, conventional pre-cleaning processes typically operate at substrate temperatures between about 250 to about 300 degrees Celsius. At these temperatures, low-k materials utilized during the fabrication of some devices is at or near its glass transitions temperature, and can contribute to poor adhesion or delamination of the low-k material and the underlying layer. Moreover, high substrate temperatures during pre-cleaning may contribute to device damage induced by gate charging and fluorine radical outgassing from exposed SOG in via sidewalls. The heated SOG are more apt to outgas at increased temperatures and may react with barrier and seed layers within the via, causing delamination and poor barrier properties.

Therefore, there is a need for an improved method and apparatus for pre-cleaning a substrate.

SUMMARY OF THE INVENTION

In one aspect of the invention, a method for pre-cleaning apertures on a substrate is provided. In one embodiment, a method for pre-cleaning apertures on a substrate includes disposing the substrate on a support member in a process chamber, cooling the substrate at least to a temperature of 100 degrees Celsius, and exposing the substrate to a pre-clean process.

In another embodiment, a method for pre-cleaning apertures on a substrate includes disposing the substrate on a support member in a process chamber, exposing an partially exposed copper layer to a pre-clean process while maintaining a substrate temperature of less than about 100 degrees Celsius, depositing a bulk copper layer or a barrier layer on the partially exposed layer.

In yet another embodiment, a method for pre-cleaning apertures on a substrate includes cooling the substrate at least to a temperature of 100 degrees Celsius in a first chamber, transferring the substrate to a second chamber and pre-cleaning an at least partially exposed copper layer in the second chamber while maintaining a substrate temperature of 100 degrees Celsius.

BRIEF DESCRIPTION OF THE DRAWINGS

A more particular description of the invention, briefly summarized above, may be had by reference to the embodiments thereof which are illustrated in the appended drawings. It is to be noted, however, that the appended drawings illustrate only typical embodiments of this invention and are therefore not to be considered limiting of its scope, for the invention may admit to other equally effective embodiments.

To facilitate understanding, identical reference numerals have been used, wherever possible, to designate identical elements that are common to the figures.

DETAILED DESCRIPTION OF THE PREFERRED EMBODIMENT

Figure 1:
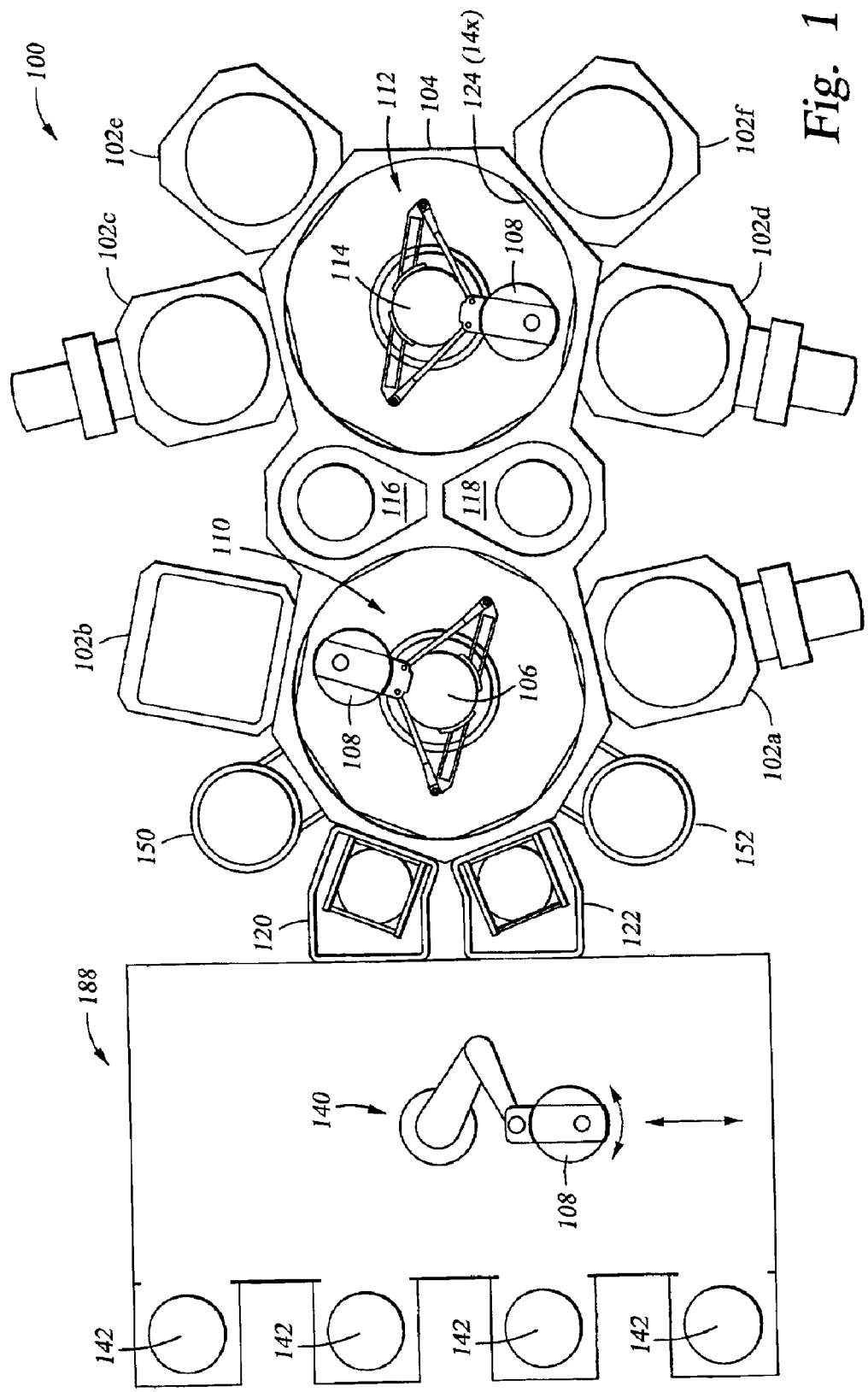
FIG. 1 is a plan view of one embodiment of a cluster tool.

FIG. 1 depicts one embodiment of a cluster tool 100 in which one embodiment of an inventive pre-cleaning method may be practiced. Generally the cluster tool 100 comprises a factory interface 188 coupled to a central transfer chamber 104 that is surrounded by a plurality of process chambers 102a–d. Examples of cluster tools that may be modified to benefit from the invention include the family of ENDURA®, PRODUCER® and CENTURA® processing platforms, all available from Applied Materials, Inc., of Santa Clara, Calif. It is contemplated that other cluster tools may be readily utilized as well.

The factory interface 188 generally includes an interface robot 140 adapted to transfer substrates 108 between one or more substrate storage cassettes 142 coupled to the factory interface 188 and the transfer chamber 104. The interface robot 140 may optionally be mounted to a rail (not shown) to facilitate lateral movement within the factory interface 188.

In the embodiment depicted in FIG. 1, the transfer chamber 104 includes a first buffer chamber 110 having a first transfer robot 106 and a second buffer chamber 112 having a second robot 114 respectively disposed therein. As shown in FIG. 1, the first buffer chamber 110 has a first load lock chamber 120, a second load lock chamber 122, and process chamber 102a–b coupled thereto. The load lock chambers 120,122 allow substrates to pass between the factory interface 188 and transfer chamber 104 without loss of vacuum. Optionally, two additional process chambers, for example, an orientation chamber 150 and a cool/down degas chamber 152 may be coupled to the first buffer chamber 110.

Slit valves 124 are respectively disposed between each buffer chamber 110, 112 and the surrounding process chambers 102a–f, orientation chamber 150, degas chamber 152 and load lock chambers 120, 122 to selectively isolate the buffer chamber environments. One slit valve that may be used to advantage is described in U.S. Pat. No. 5,226,632, issued Jul. 13, 1993 to Tepman, et al., which is hereby incorporated by reference in its entirety.

A first internal chamber 116 and second internal chamber 118 are disposed between the first and second buffer chambers 110, 112. The first and second internal chambers may be configured to perform substrate hand-offs between robots 106, 114 and/or process the substrate, for example degas or cool down.

Figure 2:
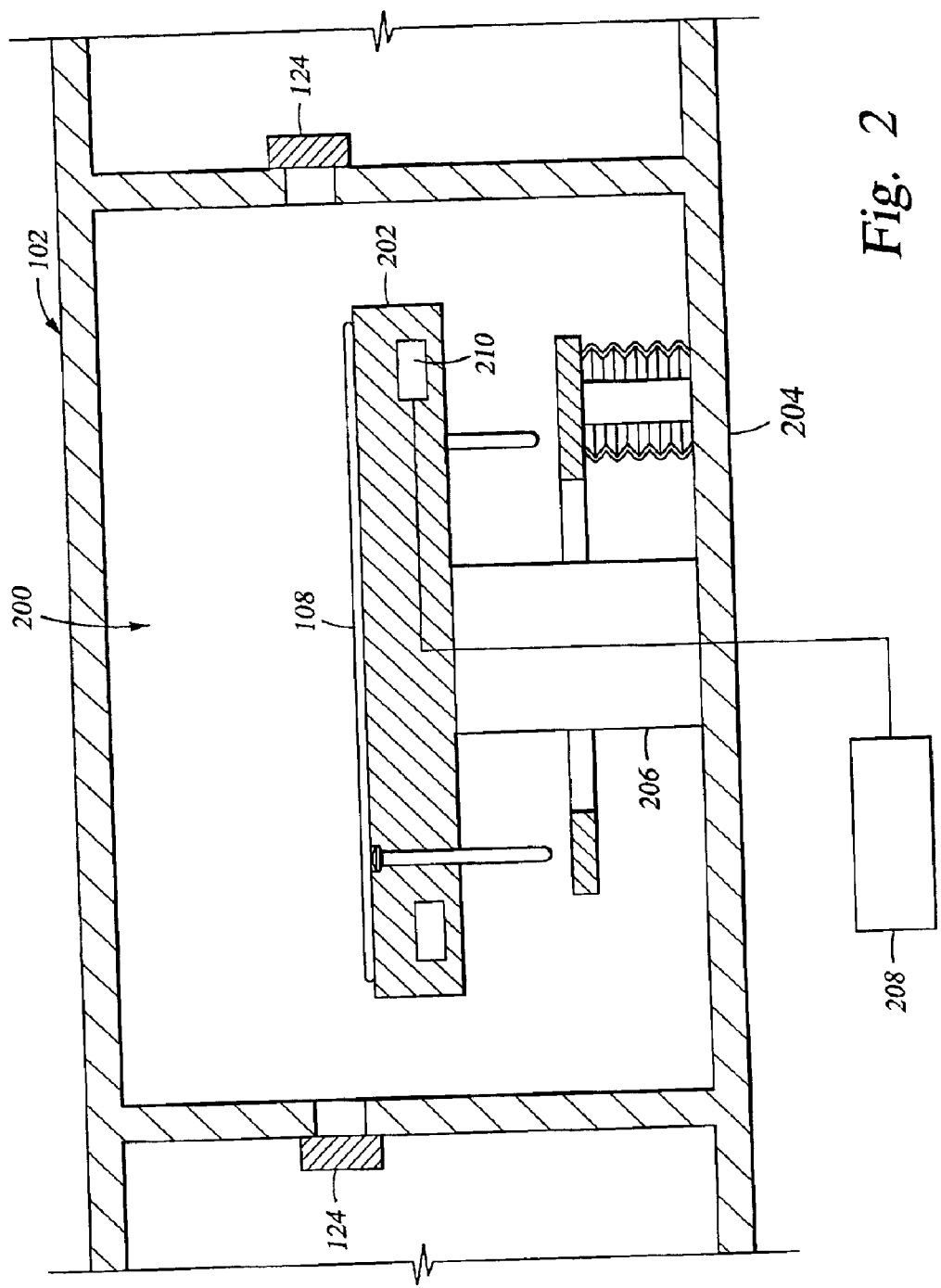
FIG. 2 is a sectional view of one embodiment of an internal chamber.

FIG. 2 depicts a sectional view of one embodiment of one of the internal chambers (e.g., 116 and/or 118) configured as a cool down chamber 200. The cool down chamber 200 generally includes a substrate support 202 coupled to a chamber bottom 204 by a shaft 206. The substrate support 202 is generally fabricated from a thermally conductive material and includes at least one channel 210 disposed therein. Alternatively, the channel 210 may be coupled to the exterior of the substrate support 202. The channel 210 circulates a heat transfer fluid supplied from a heat transfer fluid source 208. The fluid is used to thermally control the temperature of the substrate. In one embodiment, the cool down chamber 200 cools the substrate to less than 100 degrees Celsius.

The substrate support 202 of the cool down chamber 200 may be configured in other manners to facilitate cooling the substrate 108. For example, a plurality of thermoelectric devices may be coupled to the substrate support 202 to control the direction and rate of heat transfer between the substrate 108 and the substrate support 202. A substrate support having one example of a thermoelectric device coupled thereto that may be adapted to benefit from the invention is described in U.S. Pat. No. 5,996,353, issued Dec. 7, 1999 to Maxwell et al., which is incorporated herein by reference in its entirety.

Returning to FIG. 1, at least one of the process chambers 102a–f is a pre-clean chamber, for example, process chamber 102a, hereinafter referred to as pre-clean chamber 102a. Chamber 102b may additionally be configured as a pre-clean chamber for redundancy or for throughput, or be configured as a deposition, etch or other process or process support chamber. The other process chambers 102c–f surrounding the second buffer chamber 112 are generally configured based on the device being fabricated on the substrate. For one example of a configuration for applying a barrier layer prior to bulk deposition of a metal (i.e., copper), the processing chambers 102c and/or 102d are configured to deposit Ta or TaNx by physical vapor deposition (PVD) and processing chambers 102e and/or 102f are configured to deposit copper by PVD. For one example of an alternative configuration for applying a barrier layer, chamber 102f is configured to deposit TiSiN, chamber 102c is configured to deposit Ta or TaNx and chamber 102e is configured to deposit Cu. Process chambers for depositing these materials are available from Applied Materials, Inc, located in Santa Clara, Calif.

Figure 3:
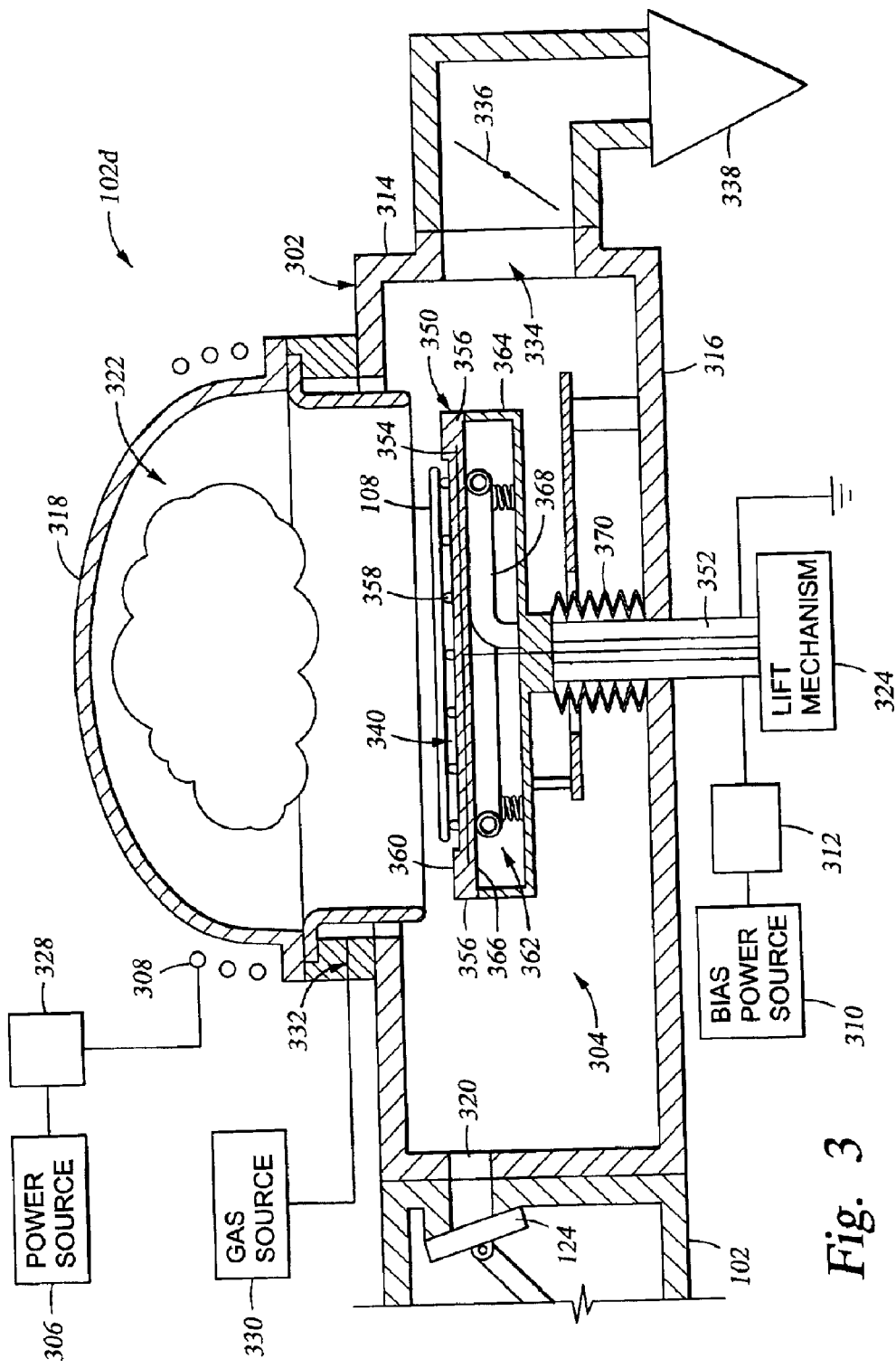
FIG. 3 is sectional view of one embodiment of a pre-clean chamber having a substrate support.

FIG. 3 depicts a cross sectional view of one embodiment of the pre-clean chamber 102a in which an embodiment of the inventive pre-cleaning method may be practiced. The pre-clean chamber 102a is preferably a dual frequency etch chamber such as the Pre-Clean II Chamber available from Applied Materials, Inc., of Santa Clara, Calif. Generally, the pre-clean chamber 102a comprises an enclosure 302, a substrate support member 304 disposed within the pre-clean chamber 102a, an RF power source 306 connected to an inductive coil 308 disposed outside the enclosure 302, and a bias power source 310 connected to the substrate support member 304 through a matching circuit 312.

The enclosure 302 includes sidewalls 314, a bottom 316 and a top 318. An access port 320 is disposed in the sidewalls 314 to allow transfer of the substrate 108 between the pre-clean chamber 102a and the transfer chamber 104. The port 320 is selectively sealed by the slit valve 124 to isolate the process region during processing. The transfer robot 114 is utilized to pass the substrate through the port 320 and place the substrate on lift pins retractably disposed through the substrate support member 304.

In one embodiment, the top 318 comprises a quartz dome. The inductor coil 308 is disposed around the top 318 and connected through a matching circuit 328 to the RF power source 306. The inductor coil 308 inductively couples power from the RF power source 306 to a plasma formed within a processing region 322 during processing. The coil 308 may be disposed equidistant from the top 318 as shown in FIG. 3, vertically stacked about the top 318 or disposed in other configurations.

A process gas source 330 is coupled to a gas inlet 332 disposed in the pre-clean chamber 102a and introduces the process gas(es) into the processing region 322 of pre-clean chamber 102a during processing. A gas exhaust 334 in fluid communication with the processing region 322 evacuates the pre-clean chamber 102a prior and during processing. A throttle valve 336 and a vacuum pump 338 coupled to the exhaust 334 maintain a predetermined pressure within the processing region 322 of the pre-clean chamber 102a during processing.

A lift mechanism 324 is coupled to the support member 304 by a shaft 352 and provides vertical movement of the support member 304 between an upper, processing position and a lower, transfer position. A bellows 370 is coupled between the support member 304 and the chamber bottom 316 to provide a flexible seal that allows vertical movement of the substrate support member 304 while preventing loss of vacuum from within the chamber 102a.

The substrate support member 304 generally comprises an electrostatic chuck 350 supported by the shaft 352. In one embodiment, the electrostatic chuck 350 contains one or more electrodes 354 embedded within a chuck body 356. The ceramic chuck body 356 is, for example, fabricated from aluminum or a ceramic material such as aluminum-nitride or boron-nitride. Utilizing a partially conductive ceramic material promotes a Johnsen-Rahbek effect to electrostatically retain the substrate to the support member 304 during high temperature processing. Other partially conductive ceramics also form useful high temperature chuck materials such as alumina doped with a titanium oxide or a chromium oxide. If the chuck body 356 is to be used at low temperatures only, then other ceramic and/or dielectric materials such as alumina are used to form the chuck body 356. Examples of electrostatic chucks that may be adapted to benefit from the invention are described in U.S. Pat. No. 5,656,093, issued Aug. 8, 1997; U.S. Pat. No. 5,764,471, issued Jun. 9, 1998; U.S. Pat. No. 4,184,188, issued Jan. 15, 1980; and U.S. Pat. No. 4,348,918 issued May 24, 1983, all of which are incorporated herein by reference in their entireties.

A wafer spacing mask 358 is typically deposited on a support surface 360 of the chuck body 356. The wafer spacing mask 358 may be disposed on the support surface 360 using a physical vapor deposition (PVD) process. The material may also be deposited by chemical vapor deposition (CVD), spraying and other coating methods. The material of the wafer spacing mask 358 generally has superior contact properties as compared to the material comprising the support surface 360 of the chuck body 356. For example, the mask material is less abrasive and more compliant (e.g., produces less particles) than the surface material of the chuck body 356. Typically, the material used to form the spacing mask 358 is a metal such as titanium, titanium nitride, stainless steel and the like. Other materials, including conductors, insulators and semiconductors that have superior substrate contacting properties as compared to the support surface 360 can also be used to fabricate the spacing mask 358.

The spacing mask material is deposited to a pre-defined thickness that maintains the wafer 108, or other workpiece, above the support surface 360 such that particles disposed on the support surface 360 do not contact the wafer surface. An illustrative thickness is approximately 3 microns. The metallic spacing masks 358 are easily cleaned to ensure that any surfaces that contact the wafer 108 are substantially free of contaminants.

Figure 4:
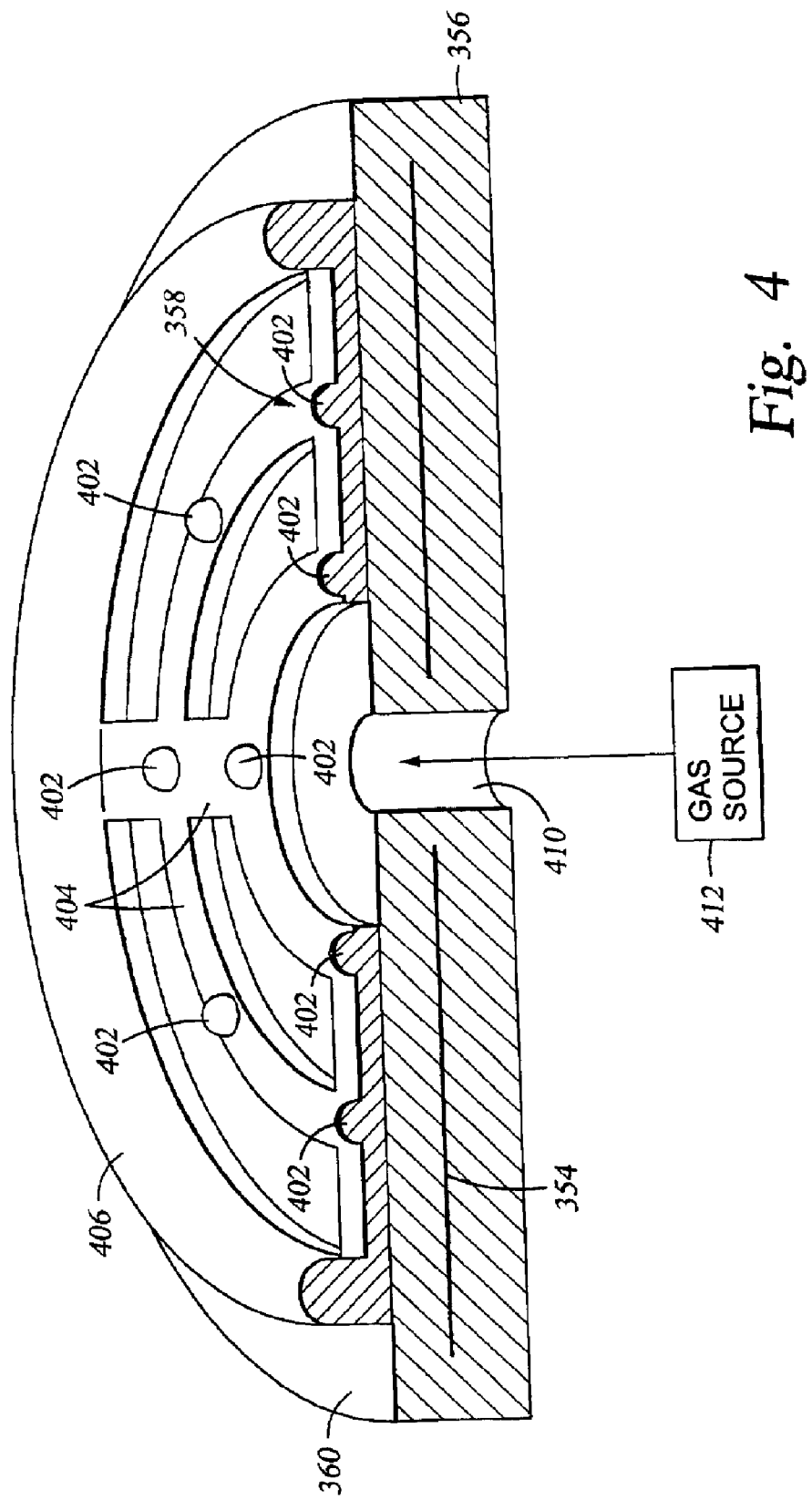
FIG. 4 is a sectional perspective view of an electrostatic chuck having a wafer spacing mask.

Referring to FIG. 4, the spacing mask 358 generally comprises a plurality of projections 402 disposed on the support surface 360 of the chuck body 356. The projections 402 may comprise individual islands or may be interconnected by a web 404. The web 404 is typically disposed closer to the support surface 360 than the projections 402 to allow backside gas flow around the projections 402.

The support surface 360 of the electrostatic chuck 350 additionally comprises a sealing ring 406 that circumscribes the projections 402. Optionally, the sealing ring 406 may be included in the wafer spacing mask 358 and coupled to the projections 402 by the web 404. As the electrodes 354 are biased to cause an electrostatic attraction between the substrate 108 and the support member 304, the sealing ring 406 contacts the substrate 108 to provide a fluid seal that traps a backside gas in a plenum 340 defined between the substrate 108 and the support surface 360 (see FIG. 3).

The backside gas is delivered to the plenum 340 through an outlet 410 disposed in the support surface 360 of the chuck body 356 from a gas source 412. The backside gas provides a heat transfer medium between the substrate 108 and the chuck body 356.

Returning to FIG. 3, the support member 304 may optionally include a heat transfer device 362 disposed proximate the electrostatic chuck 350. For example, the support member 304 may include a housing 364 that encloses a lower surface 366 of the electrostatic chuck 350. The interior of the housing 364 may comprise a heat transfer fluid to enhance thermal transfer from the electrostatic chuck 350. Additionally or alternatively, the heat transfer device 362 may be a thermoelectric device as described in the previously incorporated patent to Maxwell et al., or a conduit 368 for circulating a heat transfer fluid proximate the electrostatic chuck 350. An example of one electrostatic chuck that may be adapted to benefit from the invention is described in U.S. Pat. No. 5,507,499, issued Apr. 16, 1996 to Davenport et al., which is incorporated herein by reference in its entirety.

Figure 5:
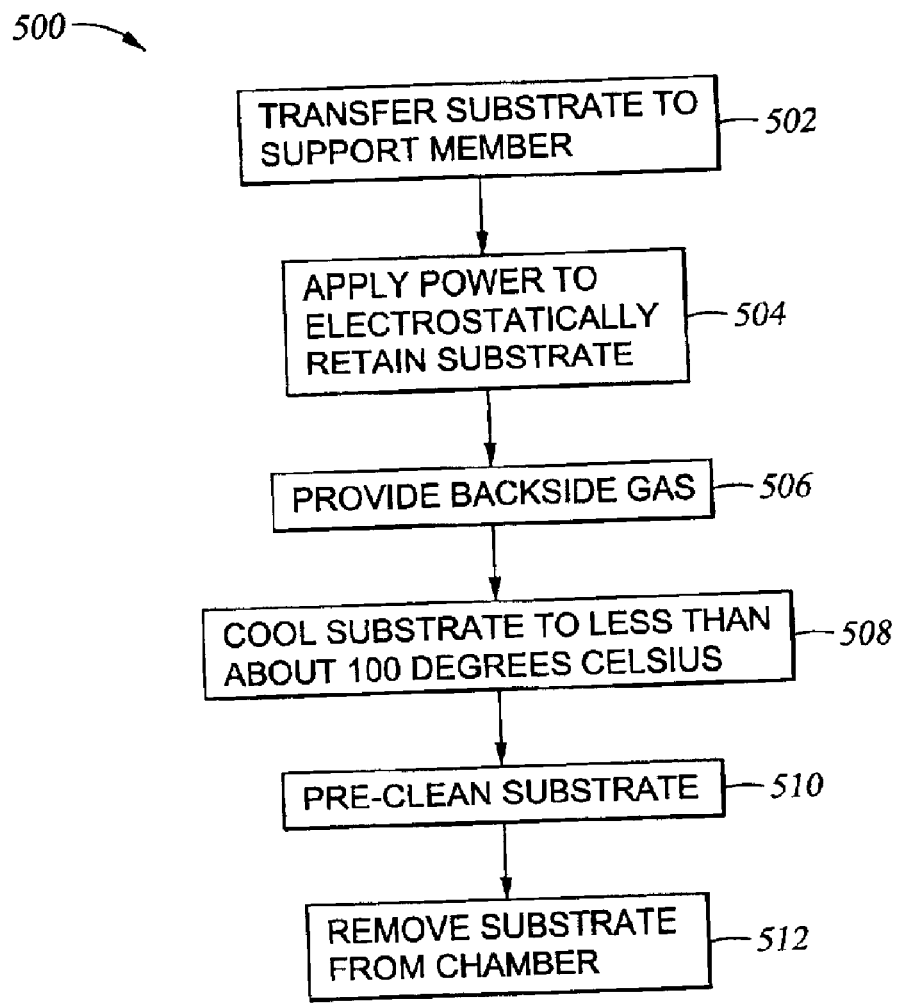
FIG. 5 is a flow diagram illustrating one embodiment of a method for pre-cleaning.

FIG. 5 is a flow diagram depicting one embodiment of a method 500 for processing a substrate utilizing the pre-clean chamber 102a depicted in FIG. 3. The method 500 generally begins at step 502 where a substrate is transferred to the support member 304. At step 504, power is applied to the electrodes 354 to electrostatically retain the substrate 108 to the support member 304. At step 506, backside gas is provided between the substrate 108 and the support member 304. At step 508, the temperature of the substrate 108 is cooled to less than about 100 degrees Celsius. At step 510, a pre-clean process is performed on the substrate. During the pre-clean process, the temperature of the substrate 108 in maintained below about 100 degrees Celsius, and in one embodiment, the substrate 108 is cooled to a temperature between about −40 and about 75 degrees Celsius. At step 512, power is removed from the electrodes 354 and the substrate 108 is removed from the chamber 102a.

The pre-clean process of step 510 may be preformed in a variety of manners to remove contaminants and native oxides from the surface of the substrate 108. For example, a processing gas comprising a non-reactive gas that may be combined with reducing or reactive gas is introduced through the gas inlet 332 into the process region. Examples of non-reactive gases that may be utilized include helium, argon, nitrogen and other non-reactive gases. Typically, the reducing or reactive gases include hydrogen, particularly for processing copper, however, other gases may be utilized including oxygen and fluorine comprising gases. The reactive gases may be utilized to reduce native oxides or react and remove photoresist residue and other contaminants.

A plasma is formed from the processing gas in the process region through inductive coupling and/or capacitive coupling. The initial plasma is preferably struck by biasing the support member 304 by applying between about 1 W and about 300 W of power at a frequency between about 100 KHz and about 100 MHz for about 3 seconds. Alternatively, the initial plasma is generated by applying power to the inductive coil 308 or by other ignition methods or devices.

During the processing, the inductive coil 308 is biased by applying between about 1 W and about 1000 W of power at a frequency between about 100 KHz and about 60 MHz while the support member 304 is biased between about 0 W and about 300 W. Alternatively, during the processing period, the plasma in the process region is sustained solely by power applied to the inductive coil 308. Alternatively, the plasma within the process region may be excited and sustained during processing by inductive coupling only, capacitive coupling only or combinations of both inductive and capacitive coupling.

During processing, the chamber pressure is preferably maintained between about 0.5 mTorr and about 100 mTorr by controlling the open/closed state of the throttle valve 336 and the power of the pump 338.

When pre-cleaning a substrate having exposed copper, a number of operating parameters are adjusted to eliminate sputtering of the copper native oxides by the ions in the plasma and to maximize the reduction reaction. These operating parameters include the power supplied to the inductive coil and the substrate support, the concentration and flow rate of the processing gas, the amount of optional reducing gas and the pressure within the process region. The temperature of the substrate 108 during processing is controlled by the backside gas and/or heat transfer device 362 within the support member 304, for example, to prevent agglomeration of sputtered metal removed from the underlying layer on the sidewalls of the features being pre-cleaned.

Figure 6:
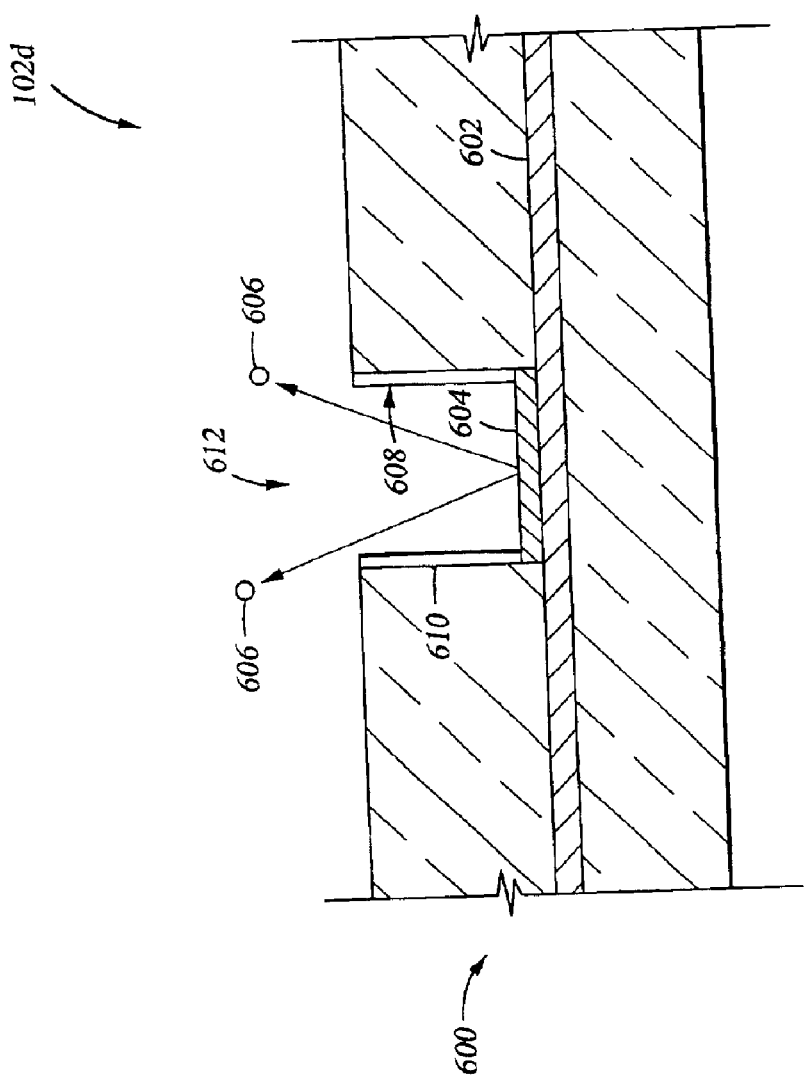
FIG. 6 is a schematic of a substrate undergoing one embodiment of a pre-clean process.

FIG. 6 schematically illustrates one example of a substrate 600 having an at least partially exposed copper layer 602 such as a PVD seed layer that includes a film of copper native oxide 604 and/or other contaminant undergoing a pre-clean process such as described above. During the pre-clean process, argon ions formed within a plasma impact upon the copper native oxide 604. The impact removes, or sputters, copper 606 from the layer 602. A portion 608 of the sputtered copper 606 may be disposed on a sidewall 610 of an aperture 612 or other portion of a feature formed on the substrate 600. In accordance with one embodiment of the invention, because the temperature of the substrate 108 is maintained at a temperature less than about 100 degrees Celsius, any sputtered copper 606 that is not exhausted from the chamber 102a and is re-deposited on the substrate does not agglomerate. Instead, it forms a substantially uniform film on the sidewall 610. Advantageously, in accordance with this embodiment of the invention, this facilitates subsequent film depositions without void formation or poor adhesion typically associated with agglomerated copper that is deposited on the sidewalls 610.

Figure 7:
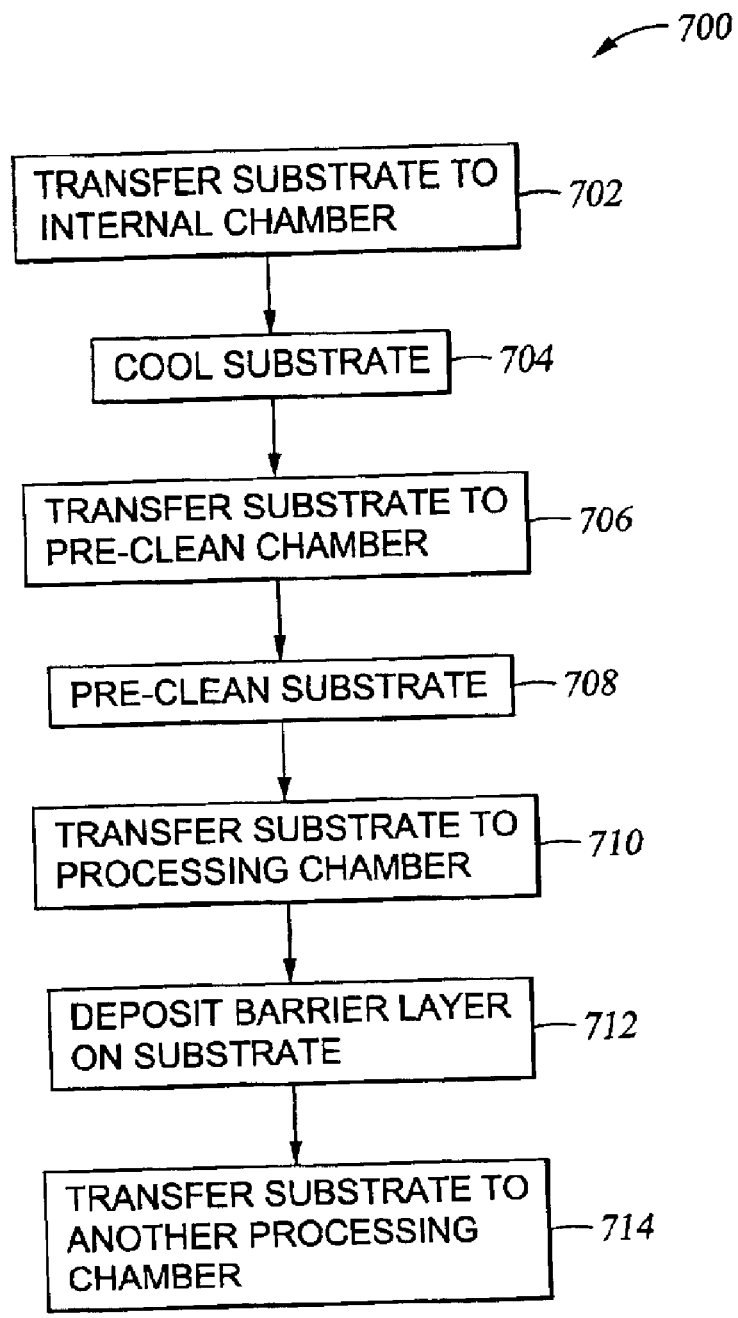
FIG. 7 is a flow diagram illustrating another embodiment of a method for pre-cleaning.

FIG. 7 is a flow diagram depicting another embodiment of a method 700 for processing a substrate utilizing the cluster tool 100 depicted in FIG. 1. The method 700 generally begins at step 702 where a substrate is transferred to one of the internal chambers 116, 118. At step 704, the substrate is cooled at least to a temperature of about 100 degrees Celsius. At step 706, the substrate is transferred to the pre-clean chamber 102a. At step 708, a pre-clean process is performed on the substrate 108.

In one embodiment, the pre-clean process of step 708 is substantially identical to the pre-clean process described above with reference to step 510 of the method 500. Alternatively, conventional pre-clean processes may be employed. The pre-clean process is generally so short in duration as not to cause the temperature of the substrate 108 to rise above about 100 degrees Celsius during pre-cleaning, thus substantially eliminating agglomeration of copper on the sidewalls of features disposed on the substrate 108.

At step 710, the substrate 108 is removed from the pre-clean chamber 102a and transferred to one of the processing chambers 102b–f coupled to the cluster tool 100. Typically, one of the chambers 102c–f coupled to the second buffer chamber 112 is utilized to minimize substrate transfer time and handling. In an embodiment that additionally reduces transfer time in applications requiring three or less deposition processes in those chamber 102c–f coupled to the second buffer chamber 112, one of the process chambers 102c–f may be configured to perform the pre-clean process.

At step 712, a barrier layer of material is deposited on the substrate 108. Typically, the deposited barrier layer is formed by CVD, PVD, electroplating or spraying. In one embodiment, a barrier layer of silicon carbide is deposited. Other materials that may alternatively be deposited include, but are not limited to, titanium nitride, tungsten nitride and tantalum nitride among others.

At step 714 the substrate 108 is removed from the chamber wherein the barrier layer was deposited and placed in another one of the deposition chambers 102b–f coupled to the cluster tool 100.

Alternatively, at step 712, a bulk layer of material is deposited on the substrate 108. Typically, the deposited bulk layer is formed by CVD, PVD, electroplating or spraying. In one embodiment, a bulk layer of copper is deposited. Other materials may alternatively be deposited.

Figure 8:
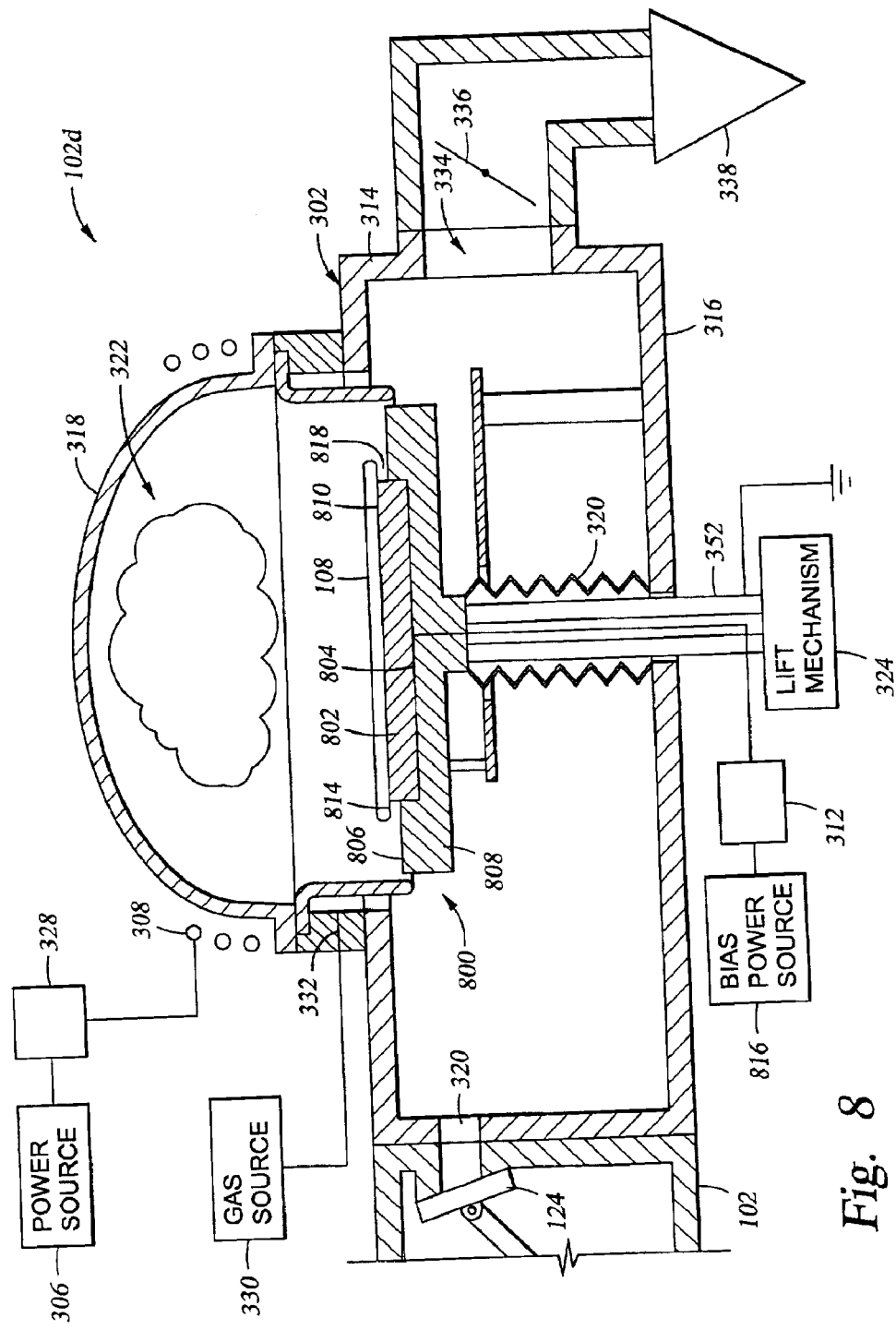
FIG. 8 is another embodiment of a substrate support.

FIG. 8 is a sectional view of another embodiment of a substrate support 800 that may be utilized as an alternative to the substrate support member 304 when practicing the method 500. Generally, the substrate support member 800 generally comprises a conductive body 802 disposed within a recess 804 on a top surface 806 of an insulator plate 808. The top surface 810 of the conductive body 802 extends slightly higher than the top surface 806 of the insulator plate 808 and is in contact with a central portion of the bottom surface or backside 814 of the substrate 108. The conductive body 802 is connected to a power source 816 that electrically biases the conductive body 802 during processing. The peripheral portion of the substrate 108 extends above the top surface 806 of the insulator plate 808 and forms a gap 818 between the backside 814 of the substrate 108 and the top surface 806 of the insulator plate 808.

While the foregoing is directed to the preferred embodiment of the present invention, other and further embodiments of the invention may be devised without departing from the basic scope thereof. For example, native oxides and other contaminants may be removed from layers other than copper. The scope of the invention is determined by the claims that follow.

What is claimed is:

1. A method for pro-cleaning apertures on a substrate, the method comprising:

disposing the substrate on a substrate support member in a process chamber;

exposing an at least partially exposed copper layer on the substrate to a pre-clean process while maintaining a substrate temperature of less than about 100 degrees Celsius; and depositing a bulk layer of copper on the at least partially exposed copper layer.

2. The method of claim 1, wherein the bulk layer of copper is formed by chemical vapor deposition, physical vapor deposition, electroplating, or spraying.

3. The method of claim 1, wherein the exposing the substrate to a pro-clean process comprises forming a plasma from a gas mixture consisting of argon.

4. The method of claim 1, further comprising electrostatically chucking the substrate to the substrate support member.

5. The method of claim 1, wherein the exposing the substrate to a pre-clean process comprises forming a plasma from a gas mixture comprising a non-reactive gas.

6. The method of claim 5, wherein the gas mixture further comprises a reactive gas.

* * * * *

UNITED STATES PATENT AND TRADEMARK OFFICE
CERTIFICATE OF CORRECTION

| | |
|---|---|
| PATENT NO. | : 6,908,865 B2 |
| APPLICATION NO. | : 10/015433 |
| DATED | : June 21, 2005 |
| INVENTOR(S) | : Martin Kranz et al. |

It is certified that error appears in the above-identified patent and that said Letters Patent is hereby corrected as shown below:

In the Claims

Column 9, Claim 1, Line 2: Change "pro-cleaning" to --pre-cleaning--

Column 10, Claim 3, Line 2: Change "pro-clean" to --pre-clean--

Signed and Sealed this

Nineteenth Day of September, 2006

JON W. DUDAS
*Director of the United States Patent and Trademark Office*